United States Patent [19]

Bockelman et al.

[11] Patent Number: 5,793,213
[45] Date of Patent: Aug. 11, 1998

[54] METHOD AND APPARATUS FOR CALIBRATING A NETWORK ANALYZER

[75] Inventors: David E. Bockelman, Plantation; William R. Eisenstadt, Gainesville, both of Fla.

[73] Assignee: Motorola, Inc., Schaumburg, Ill.

[21] Appl. No.: 691,085

[22] Filed: Aug. 1, 1996

[51] Int. Cl.[6] ............................................. G01R 35/00
[52] U.S. Cl. ...................................... 324/601; 324/638
[58] Field of Search .................................. 324/601, 638, 324/642, 650, 612

[56] References Cited

U.S. PATENT DOCUMENTS

| | | | |
|---|---|---|---|
| 5,552,714 | 9/1996 | Adamian et al. | 324/638 |
| 5,578,932 | 11/1996 | Adamian | 324/601 |
| 5,646,536 | 7/1997 | Ishihara | 324/601 |

OTHER PUBLICATIONS

Eul, H.J. and Schiek, B., *Thru–Match–Reflect: One Results of a Rigorus Theory for DeEmbedding and Network Analyzer Calibration*, pp. 908–914, Proc. 18th European Microwave Conference, 1988.

*Primary Examiner*—Michael Brock
*Attorney, Agent, or Firm*—Barbara R. Doutre

[57] ABSTRACT

A calibration standard (204) provides interconnection between measurement ports (212, 214, 216) of a network analyzer (202) having at least three measurement ports. Once the measurement ports (212, 214, 216) of the network analyzer (202) are interconnected, a non-zero signal transfer is generated between each of the measurement ports and at least one other measurement port as part of the calibration process. Interconnecting all of the measurement ports (212, 214, 216) together and generating non-zero signal transfers characterizes the relative relationship between the ports during the calibration process. The calibration standard (204) can also provide a desired level of mode conversion.

28 Claims, 9 Drawing Sheets

METHOD AND APPARATUS FOR CALIBRATING A NETWORK ANALYZER

TECHNICAL FIELD

This invention relates in general to network analyzers and more particularly to the calibration technique and calibration standards used in network analyzer test systems.

BACKGROUND

Network analyzers are widely used in radio frequency (RF) and microwave applications for the measurement of a circuit's unknown scattering parameters (s-parameters). Since network analyzers are non-ideal, the measurements made with network analyzers have errors. These errors can be grouped into two major categories: systematic and non-systematic. Systematic errors include all static (repeatable) errors, and non-systematic errors include noise, drift, and other time variant errors.

Theoretically, any systematic error can be characterized. This process, called calibration, involves measuring certain well known devices, called standards, with the non-ideal network analyzer. With proper application, these raw measurements can be used to solve for all systematic errors. After calibration, the systematic network analyzer errors can be removed from the measurements of any unknown device; this is called error correction.

With a two-port network analyzer, the selection of calibration standards is relatively straight forward, provided that at least one standard is a through line, or its equivalent. The selection of calibration standards becomes increasingly difficult however, when a network analyzer encompasses more than two measurement ports. In particular, network analyzers with three or more ports can not be successfully calibrated with combinations of through lines. For example, in a four-port analyzer, today's calibration standards limit the calibration to the interconnection of two ports, two at a time. While it would appear that a calibration could be completed using through connections (or pairs of throughs) between all possible combinations of two ports, the outcome of doing such a calibration only generates a relative measurement between each independent pair of ports. Using pairs of throughs to calibrate a network analyzer having three or more ports, thus results in ambiguous data, particularly with regards to phase relations between the ports. This limitation has not been resolved by the prior art without approximation or simplifying assumptions.

Additionally, network analyzers having more than two ports face a new set of problems in terms of measurement accuracy. For example, a differential and common mode network analyzer (i.e. mixed-mode) is a network analyzer which is specialized to measure differential circuitry. The mixed-mode network analyzer can measure the differential and common mode responses of a device under test (DUT). It can also measure mode conversion between modes, such as differential-to-common mode conversion. Different devices can have dramatically different levels of mode conversion, making accurate error correction difficult for the mode conversion responses.

Accordingly, there is a need to address the calibration of network analyzers having more than two ports and the standards used in such calibrations. It would be a further benefit if the issue of mode conversion could also be addressed in such calibrations.

DETAILED DESCRIPTION OF THE PREFERRED EMBODIMENT

In accordance with the present invention, a calibration standard and calibration technique to be described herein address the problems associated with calibrating a network analyzer having more than two ports as well as the issue of mode conversion. To appreciate the scope of the present invention, a full description of a prior art network analyzer error model is useful.

Figure 1:
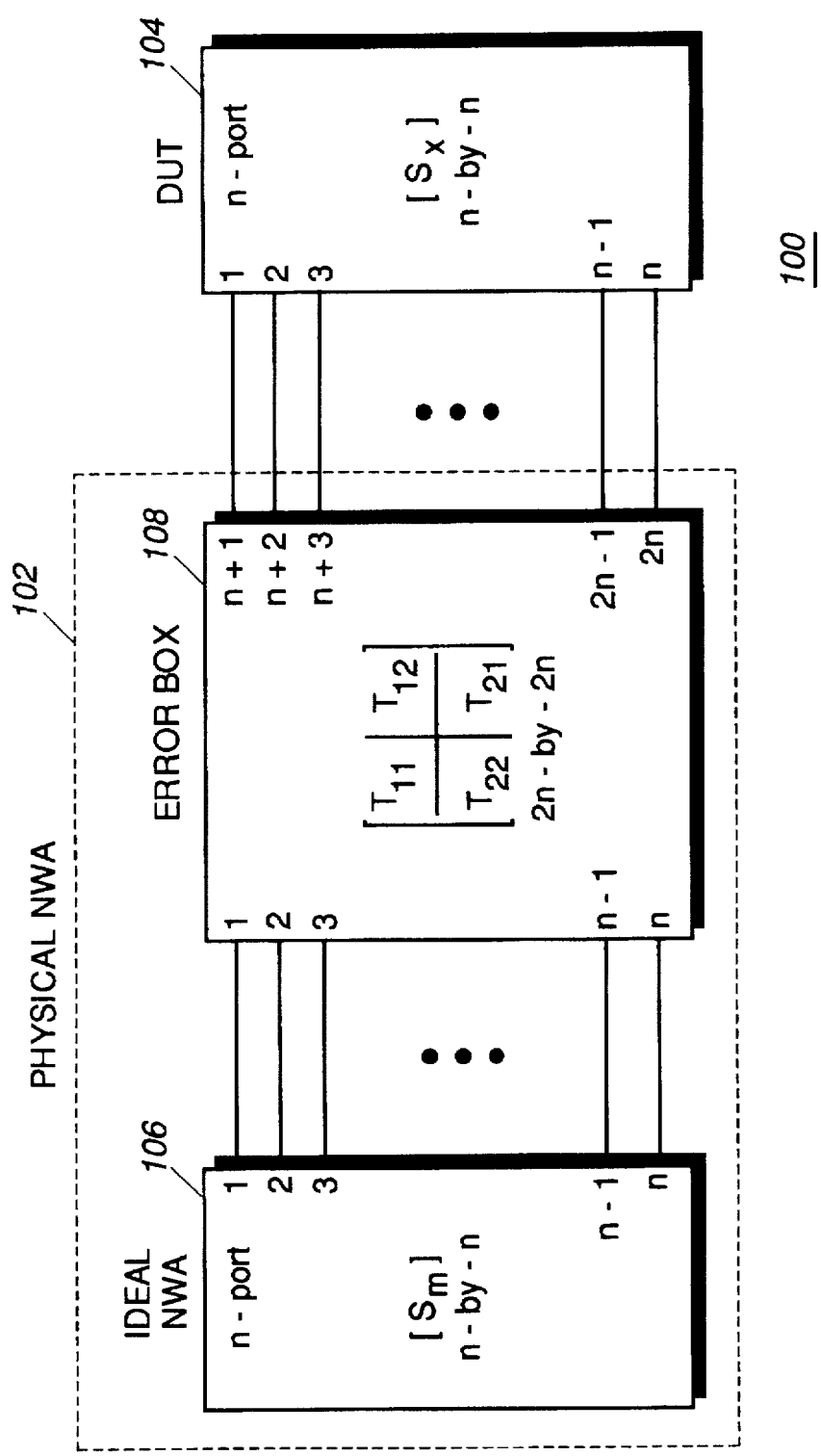
FIG. 1 is a prior art block diagram of a full isolation network analyzer error model.

Referring now to FIG. 1, there is shown a prior art error model 100 for a general n-port network analyzer (NWA) 102 measuring a device under test (DUT) 104. Network analyzer 102 is represented by an ideal network analyzer 106 and an error box 108. In error model 100, variable n represents the number of ports of the analyzer for the DUT 104 having n ports. Error model 100 includes all possible systematic sources of error in a linear time invariant network analyzer. Error box 108 represents all unknown error (signal) paths including undesired crosstalk between the ports. In general, there are $4n^2$ unknowns, and calibration is the process, technique, or method of determining these unknowns.

When the error box 108 is expressed in chaining scattering parameters (called t-parameters), the relationship between measured and actual DUT scattering parameters (s-parameters) can be represented by a linear function of the unknown errors. The defining equation is:

$$T_{11}S_{xi}+T_{12}-S_{mi}T_{21}S_{xi}-S_{mi}T_{22}=\bar{0} \quad (1)$$

where $T_{11}$, $T_{12}$, $T_{21}$, and $T_{22}$ represent the matrix partitions of the error box matrix, and $S_{xi}$ and $S_{mi}$ represent the actual and measured s-parameters of the i-th standard (or DUT), respectively. Upon expansion, equation (1) gives $n^2$ equations which are linear in elements T. This set of expanded equations can be written in a compact form as:

$$A \cdot \bar{t} = \bar{0} \quad (2)$$

where A represents a matrix of coefficients and t represents a vector of unknowns constructed from the elements of T.

Several possible conditions influence the existence of solutions to the set of equations. The matrix of coefficients, A, is characterized by a dimension and a rank, and if A has at least as many rows as columns, then a solution can exist. With this condition, if the rank of the matrix of coefficients, A, is equal to the number of columns minus one, then a non-trivial solution exists. This solution has one degree of arbitrariness since a solution multiplied by any complex number is also a solution. In other words, in this case, the solution space of equation (2) is spanned by a single vector. The arbitrary scale factor is unimportant as it is factored out during DUT data correction subsequent to the calibration process. This solution will be referred to as an ordinary solution. For the purposes of this application, an ordinary solution will be defined as being unique within a complex scalar.

As previously mentioned in the Background, using pairs of throughs in the calibration of a four-port network analyzer will generate ambiguous results. This is because the resulting A matrix has a rank which is too small to provide an ordinary solution. Regardless of how many throughs are used, the rank will never be sufficient for an ordinary solution.

In accordance with the present invention, a calibration standard and technique are provided which define the relative relationship between measurement ports of a network analyzer having at least three measurement ports. The calibration standard of the present invention interconnects all measurement ports (n) of a network analyzer such that non-zero transfer functions are generated between each measurement port and at least one other measurement port, the number of non-zero transfer functions being at least equal to the number of network analyzer measurement ports minus one (n−1). For the purposes of this application, the terms non-zero transfer function and non-zero signal transfer will be used interchangeably and will also be referred to simply as a "transfer". The transfer between measurement ports need not be bi-directional (or reciprocal). The calibration standard of the present invention can be implemented in a variety of configurations, a few of which shall be described in the embodiments to follow.

Figure 2:
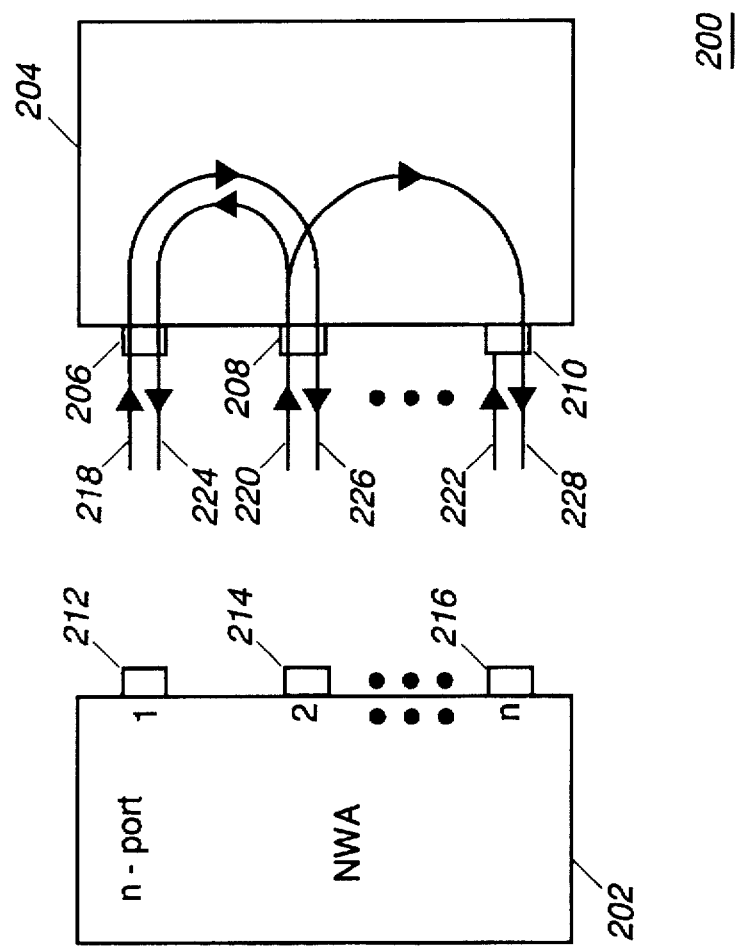
FIG. 2 is calibration test system in accordance a first embodiment of the invention.
Figure 3:
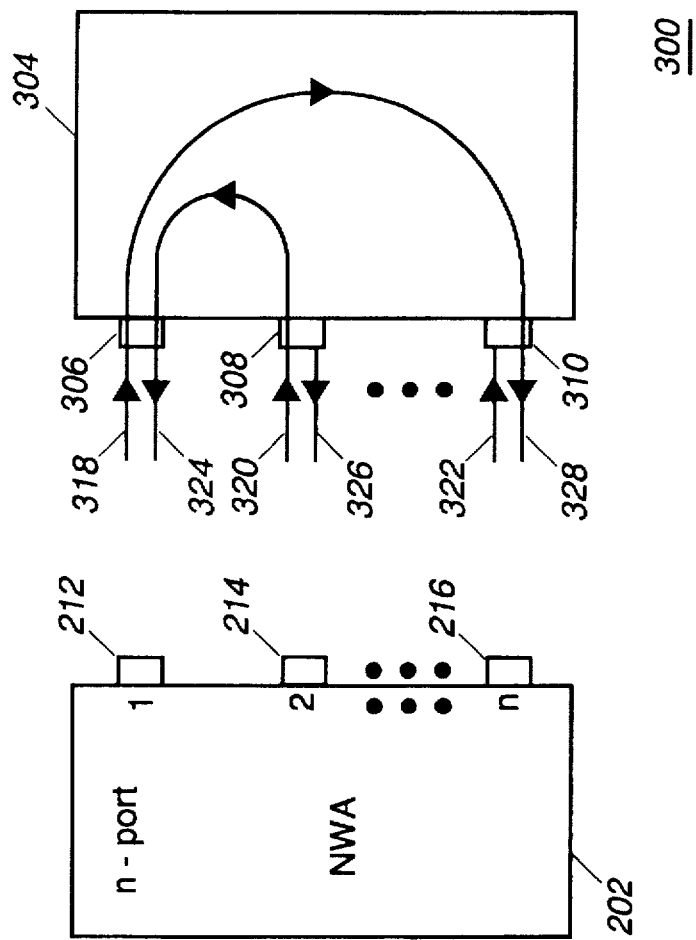
FIG. 3 is a calibration test system in accordance a second embodiment of the invention.

Referring now to FIGS. 2, 3 there are shown block diagrams of a calibration test system in accordance with first, and second embodiments of the present invention. Like numerals have been carried forward where applicable throughout these two embodiments. Test systems 200, 300 include a network analyzer 202 having at least three measurement ports (n) 202 and a calibration standard, illustrated in terms of a signal flow diagram, for each embodiment. Calibration standard 204 represents the standard for the first embodiment (FIG. 2), and calibration standard 304 represents the standard for the second embodiment (FIG. 3).

In accordance with the present invention, each of the calibration standards 204, 304 provides at least as many calibration ports as there are measurement ports (n) 212, 214, 216 on the network analyzer 202. Calibration standard 204 provides calibration ports 206, 208, 210. Calibration standard 304 provides calibration ports 306, 308, 310. Each calibration port of the calibration standards 204, 304 is shown in terms of an input signal being received from the network analyzer 202 and an output signal being transferred out.

Each measurement port 212, 214, 216 of the network analyzer 202, when coupled through the calibration standard of the present invention, is provided with a non-zero transfer function to at least one other measurement port, the number of non-zero transfer functions being at least equal to the number of network analyzer ports minus one (n−1). Reciprocal and reflective paths are not required and may not be included in the "count" of n−1 paths.

In the first embodiment of the invention, signal 218 is received at the first calibration port 206 and then transferred through a non-zero signal path to the second port 208 where it is output as signal 226. Signal 220 is received at the second calibration port 208 and then transferred to the first calibration port 206 where it is output as signal 224. Signal 220 is also transferred through another non-zero signal path to calibration port 210 where it is output as signal 228. Signal 222 is received at the last calibration port 210, however, no signal transfer takes place. Both signals being transferred and those being reflected back can be measured by the network analyzer 202. While the transfer between the first and second ports, 206, 208 is shown as reciprocal, these transfers are only counted once in terms of meeting the n−1 requirement. Thus, if calibration standard 204 is a three port standard, then three measurement ports of a three-port network analyzer can be monitored simultaneously using two of the paths shown, one of which must be the non-reciprocal path between ports 208, 210.

Conceptually, the calibration standard of the present invention defines the relative relation between the plurality of measurement ports 212, 214, 216 of the network analyzer 202. Including the calibration standard described by the invention as part of a system calibration allows for an ordinary solution to the system of calibration equations (1), (2) to be determined.

During the calibration process of network analyzer 202 using calibration standard 204, the calibration standard 204 is coupled to the network analyzer 202 through the interconnection of calibration ports 206, 208, 210 to measurement ports 212, 214, 216. All of the measurement ports 212, 214, 216 of the network analyzer 202 are thus operatively coupled together. A signal is injected from at least one measurement port 212, 214, 216 into at least one of the calibration ports 206, 208, 210 which generates a non-zero signal transfer to at least one other measurement port. In the embodiment shown in FIG. 2, signal 220 is transferred to calibration ports 206 and 210. Signal 218 is then injected into port 206 and transferred to port 208.

Depending on the signal paths provided by the calibration standard, certain input signals can be injected simultaneously to reduce calibration time. Simultaneous injection of signals can be done on signal paths having uncommon calibration ports. This would be beneficial to analyzers having many measurement ports.

The calibration standard of the present invention may be used in conjunction with other standards known in the art to complete the calibration process. Alternatively, the calibration standard of the present invention may be used with multiple standards also formed in accordance with the present invention, to complete the calibration process. By transferring non-zero signals between a predetermined number of measurement ports, relative relations between all measurement ports of a network analyzer become defined while solving the system of calibration equations (2).

Referring again to FIG. 3, the second embodiment shows another example of the calibration standard of the present invention using a different signal flow diagram. In the second embodiment of the invention, signal 318 is received at the first calibration port 306 and then transferred to the last port 310 through a non-zero signal path where it is output as signal 328. Signal 320 is received at the second calibration port 308 and then transferred to the first calibration port 306 through a non-zero signal path where it is output as signal 324. If calibration standard 304 is a three port standard for use with a three port network analyzer, then three measurement ports 212, 214, 216 of the network analyzer can be monitored simultaneously using the two signal paths shown.

The descriptions for the first two embodiments extend to analyzers having any number of ports. A four port analyzer, for example, would require a standard having at least three non zero signal flow paths. Each measurement port of the network analyzer, once coupled through the standard of the present invention, then has a non-zero transfer function with at least one other measurement port. While the first two embodiments have shown and described minimum requirements for the calibration standard with regards to the number of ports and transfers, it may also be desirable to have standards which exceed these minimums without departing from the scope of the invention.

Figure 4:
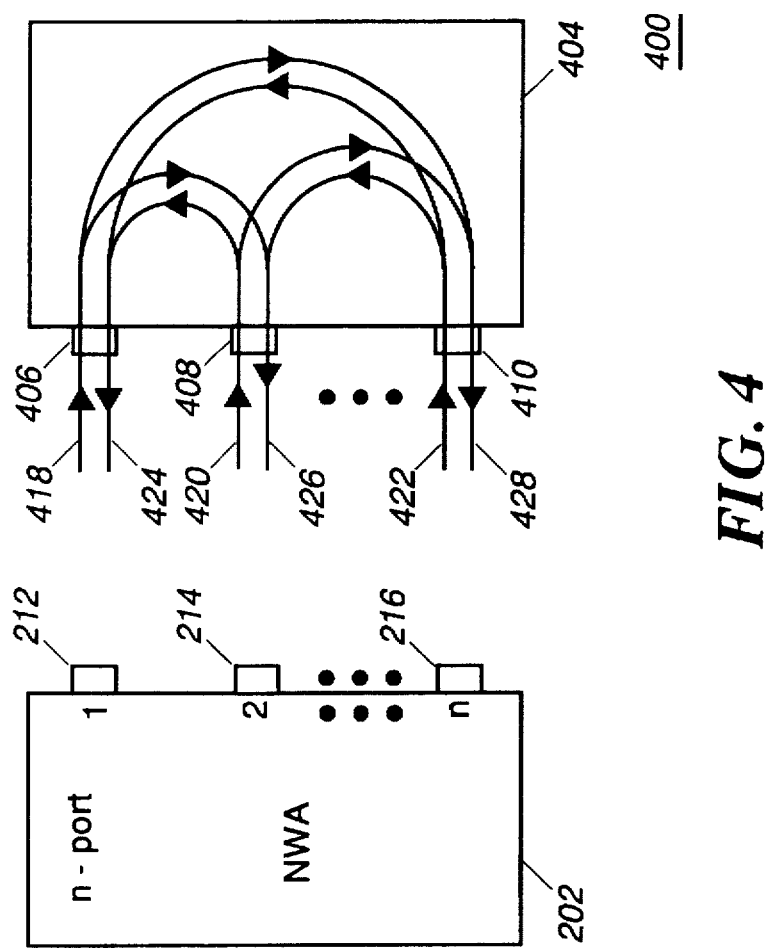
FIG. 4 is a calibration test system in accordance a third embodiment of the invention.

While the first two embodiments describe examples of calibration standards meeting the minimum requirements, the calibration standard of the present invention can be extended beyond these requirements. Referring now to FIG. 4, there is shown a block diagram a calibration test system 400 in accordance a third embodiment of the invention. Test system 400 includes the n-port network analyzer 202 having at least three measurement ports and a calibration standard 404 illustrated in terms of a signal flow diagram. In accordance with the third embodiment of the invention, the calibration standard 404 interconnects "all" measurement ports of the network analyzer 202 such that non-zero signal transfers are generated between "all" of the measurement ports. The calibration standard 404 provides at least as many calibration ports 406, 408, 410 as there are measurement ports (n) 212, 214, 216 on the network analyzer 202. Each calibration port 406, 408, 410 is shown in terms of an input signal being received and an output signal being transferred out.

Representative signal flows have been depicted in calibration standard 404. Signals 418, 420, 422 are shown as input signals (not necessarily being injected simultaneously) while signals 424, 426, 428 represent output signals having been transferred through various non-zero signal paths. Both signals being transferred and those being reflected back can be measured by the network analyzer 202. All measurement ports 212, 214, 216 of the network analyzer can be monitored simultaneously.

Calibration standard 404 defines the relative relation between the plurality of measurement ports 212, 214, 216 of the network analyzer 202. Performing a system calibration including the calibration standard 404 of the third embodiment allows for an ordinary solution for the system of calibration equations (1), (2) to be determined.

Hence, the calibration standard of the present invention provides a standard which operatively interconnects all measurement ports of a network analyzer to each other. Once all the measurement ports are interconnected, non-zero signals are transferred between the ports during a calibration to develop relative relationships therebetween. The measurement ports can be interconnected to meet the minimum requirement described in the first two embodiments or can be expanded upon, such as that described in the third embodiment. The calibration standard of the present invention can be implemented with a variety of components as will be described herein.

Figure 5:
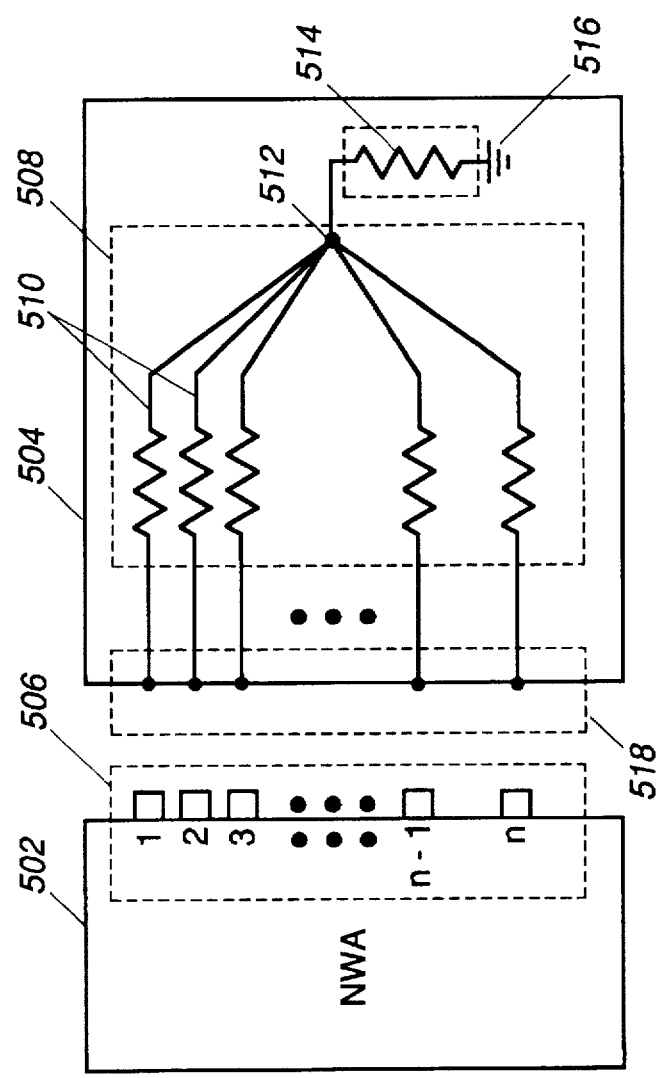
FIG. 5 is a calibration test system including an example of a calibration standard formed in accordance with the third embodiment of the invention.

Referring now to FIG. 5, there is shown a calibration test system 500 including a network analyzer 502 and an example of a calibration standard 504 formed in accordance with the third embodiment of the invention. Network analyzer 502 has at least three measurement ports 506, and in accordance with the third embodiment of the invention, calibration standard 504 provides non-zero transfer functions between all of these measurement ports. Calibration standard 504 includes a plurality of circuit elements, shown here as resistive elements 510, configured in a star network 508 joined at a common node 512. Each arm of the star network 508 is coupled to a calibration port 518. The common node 512 is optionally coupled through another resistor 514 to ground potential 516.

This implementation of the third embodiment allows the value of each resistive element 510 and 514 to be measured directly within a two-terminal ohmmeter. During the fabrication process of the calibration standard 504, trimming individual resistors may be desired.

In accordance with the third embodiment of the invention, calibration standard 504 interconnects all of the measurement ports 506 to allow for non-zero signal transfers between all measurement ports 506 during the calibration process of the network analyzer 502. The values of the resistive elements 510 are selected to allow for a non-zero signal transfer between all measurement ports 506 of the network analyzer 502. It is preferable that each resistive element 510, 514 be trimmable for adjusting the level of signal transfer between the ports.

During the calibration process of network analyzer 502, calibration standard 504 is coupled the network analyzer 502 through the interconnection of calibration ports 518 to measurement ports 506. All of the measurement ports 506 of the network analyzer 502 are thus operatively coupled together through the star network 508. A signal is injected from at least one measurement port 506 into at least one of the calibration ports 518 which generates a non-zero signal transfer between each of the other measurement ports of the analyzer 502. By interconnecting all of the measurement ports 506 and transferring non-zero signals between these measurement ports, relative relations between all measurement ports of a network analyzer 502 become defined during the solving of the system of calibration equations (2). While shown and described in terms of resistive elements, the calibration standard of the present invention can be implemented using a variety of other lumped or distributed (or combinations thereof) elements with either fixed or variable values.

Figure 6:
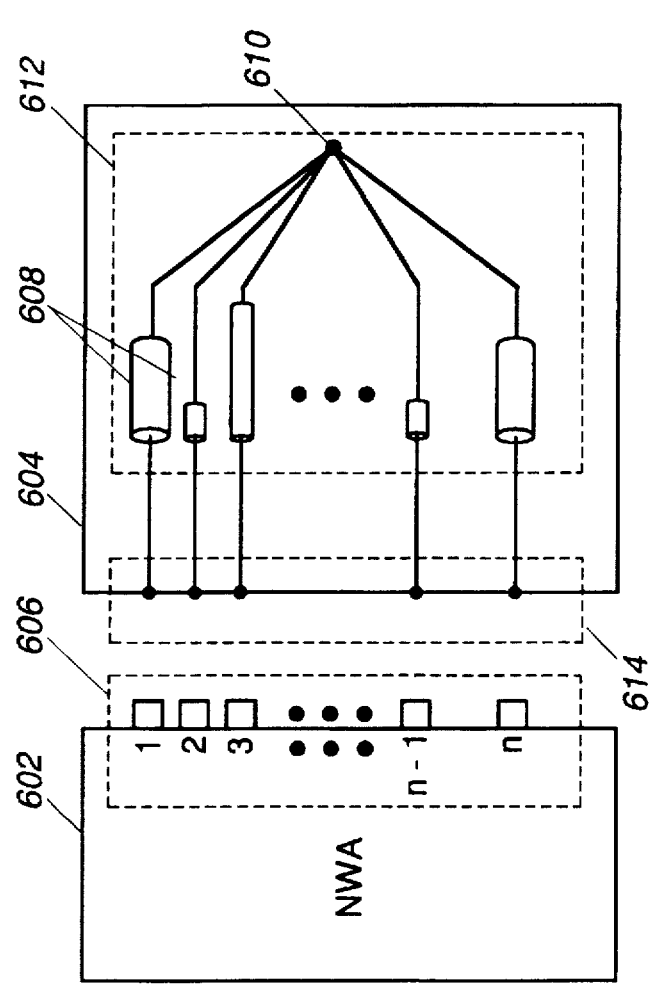
FIG. 6 is a calibration test system including another example of a calibration standard formed in accordance with the third embodiment of the invention.

Referring now to FIG. 6, there is shown a calibration test system 600 including a network analyzer 602 and a calibration standard 604 formed in accordance with the third embodiment of the invention. Once again the network analyzer 602 includes at least three measurement ports 606. This implementation of the calibration standard 604 utilizes a plurality of transmission lines 608 to interconnect each of the measurement ports 606 of the network analyzer 602. The plurality of transmission lines 608 are shown configured in a star network 612 joined at a common node 610. Calibration standard 604 includes calibration ports 614 which interconnect to the measurement ports 606 of network analyzer 602. Calibration standard 604 includes at least as many calibration ports 614 as there are measurement ports 610 to be calibrated on the network analyzer 602. Once the calibration ports 614 are coupled to the measurement ports 606, the transmission lines 608 provide non-zero transfer functions between each of the measurement ports 606 to permit relative measurements to be taken therebetween.

Calibration standards implemented with transmission lines are easily modeled and accurately simulated. Developing the calibration standard 604 using transmission lines 608 provides the advantage of tight tolerancing specifications which are less sensitive to variations in fabrication processes.

Figure 7:
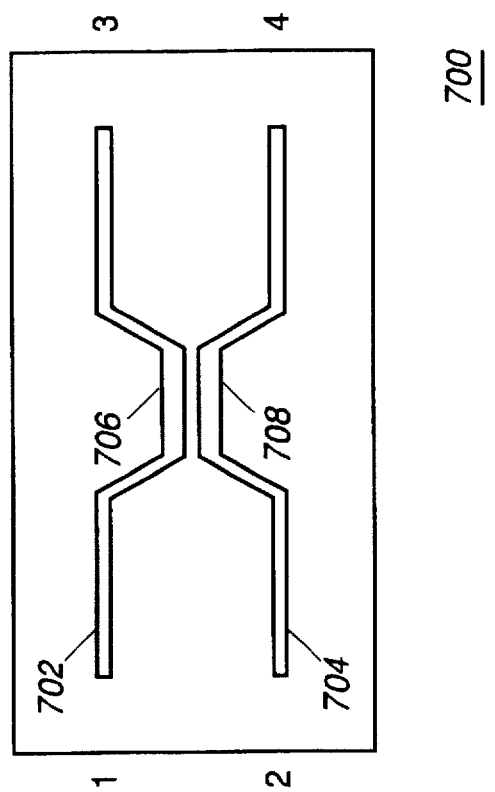
FIG. 7 is another embodiment of a calibration standard in accordance with the present invention.

Referring now to FIG. 7, there is shown another embodiment of the calibration standard of the present invention utilizing transmission lines. In this embodiment, the calibration standard 700 provides interconnectivity for a four port network analyzer (not shown). Two transmission lines 702, 704, electrically coupled through their center portions 706, 708, provide operative coupling between four measurement ports of the network analyzer. The transmission lines are designed such that non-zero transfer function relationships occur between each measurement port and at least one other measurement port of the network analyzer the number of non-zero transfer functions being at least equivalent to the number of measurement ports minus one. Other elements, such as passive or active devices and gyro-magnetic devices, can also be used.

The calibration standard of the present invention allows a calibration process to be performed on a network analyzer having at least three measurement ports by operatively coupling the ports of the analyzer, injecting a signal from one or more ports of the network analyzer, and generating a non-zero signal transfer between each of the measurement ports and at least one other measurement port. The non-zero signal transfer between measurement ports allows for relative measurements to be made between all ports at the same time. By including the calibration standard of the present invention during a calibration process, an ordinary solution to the system of calibration equations (1), (2) can be achieved thus eliminating the ambiguities associated with measuring only two ports at a time. The time involved in performing a calibration is also reduced since all of the ports are coupled at the same time.

The calibration standard of the present invention can be implemented as an individual standard or integrated directly "on chip". A variety of substrates, such as ceramics, thin film metals, as well as others, can be used to fabricate the calibration standard of the present invention using well known manufacturing processes.

The calibration standard described by the invention can be used in conjunction with other standards, such as throughs or various termination impedances, during the calibration process of a network analyzer having at least three measurement ports. Alternatively, the calibration process can be performed using multiple calibration standards developed in accordance with the present invention which provide the simultaneous interconnection and non-zero signal transfer between each measurement port and at least one other measurement port with the number of non-zero signal transfers being at least equivalent to the number of measurement ports minus 1. Including the calibration standard of the present invention in the calibration process of a network analyzer allows relative measurements between all ports and provides an ordinary solution for the system of calibration equations (1), (2).

In addition to providing an ordinary solution to the system of calibration equations (1), (2), the calibration standard described by the invention can also incorporate a predetermined level of mode conversion into the calibration. The effects of noise, repeatability issues, and/or dynamic range limitations on corrected DUT data will be minimized at this predetermined level, thus enhancing the accuracy of measurements taken at this level.

A group of calibration standards can also be developed to provide different levels of mode conversion to the calibration process. The impedance values of the calibration standard of the present invention can be selected to provide various levels of mode conversion. When a group of such standards are used, the overall range of mode conversion accuracy can be improved as well. For example, a set of calibrations standards can be fabricated with −20 dB and −50 dB levels of mode conversion. After calibration, the corrected system then has its best accuracy nearer the −20 dB and −50 dB levels. Since many devices operate at various mode conversion levels, the advantage of being able to calibrate at these levels provides a significant benefit in terms of improved measurement accuracy.

Figure 8:
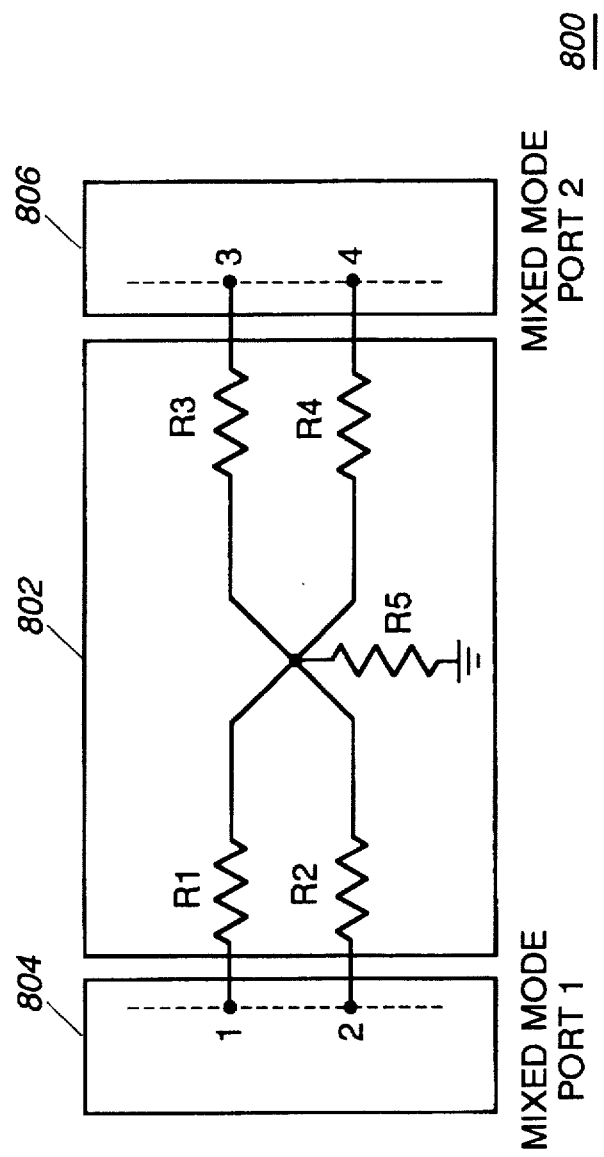
FIG. 8 is an embodiment of a calibration test system for a mixed-mode network analyzer in accordance with the present invention.

Referring to FIG. 8, there is shown an embodiment of a calibration test system 800 for a mixed-mode network analyzer in accordance with the present invention. Test system 800 includes a schematic representation of a calibration standard 802 formed in accordance with the present invention. Calibration standard 802 includes a four-port resistive star network configuration formed of resistors R1, R2, R3, R4 coupled through a fifth resistor R5 to ground. Resistor R5 is an optional resistor which is included to provide further design parameter if desired. Calibration standard 802 is coupled between four terminals, 1, 2, 3, 4 of a mixed-mode network analyzer. When treated as a differential device, terminal pairs 1 and 2 form a first differential port 804, and likewise terminal pair 3 and 4 form a second differential port 806. A differential mode signal can be driven into one of these pairs 804, 806 and two different types of signals are generated at the second pair—a pure differential signal and a common mode signal. The combination of these two signals is referred to as a mixed-mode signal. Well known simulation techniques, such as linear circuit simulators, can be used to model the calibration standard 802 and determine component values which provide the desired levels of mode conversion. The values of resistors R1, R2, R3, R4 and optional resistor R5 can thus be selected to provide certain differential-mode, common-mode, and mode conversion responses.

Figure 9:
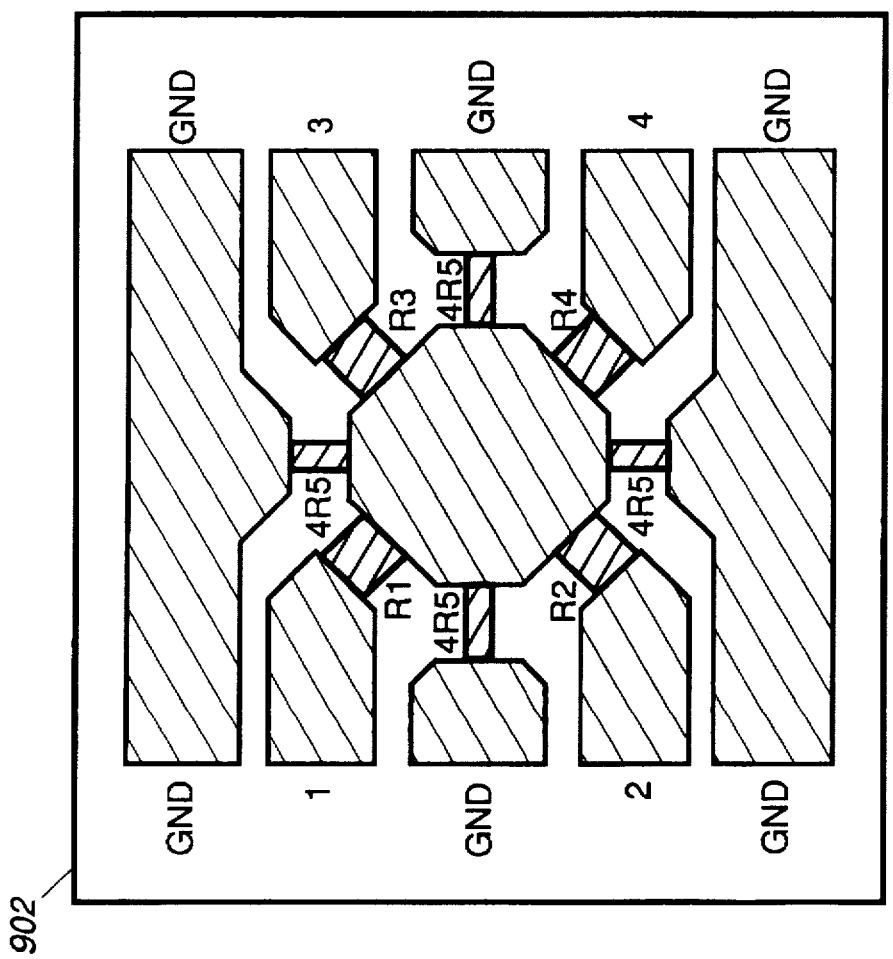
FIG. 9 is an example of an implementation of the calibration standard of FIG. 8.

FIG. 9 shows an example of the calibration standard depicted in FIG. 8 being implemented on a ceramic substrate with a thin film metal structure. Like numerals have been carried forward where applicable. Calibration standard 900 provides simultaneous interconnection for a four-port network analyzer using the resistive star network of FIG. 8 and also provides a predetermined level of mode conversion. A top planar view of calibration standard 900 shows a substrate 902 including resistors R1, R2, R3, R4 having various widths. Resistors R1, R2, R3, R4 can be trimmed if needed to optimize the level of mode conversion of the calibration standard. The various widths of resistors R1, R2, R3, R4 represent variations in resistor values. For purposes of symmetry, resistor R5 has been split into four equal resistors, each being four times the value of resistor R5.

Adapting the calibration standard described by the invention with a desired level of mode conversion and implementing it onto a thin film metal structure makes it ideal for wafer probe applications. Predetermined levels of mode conversion can be modeled into the calibration standard to provide accurate mixed-mode network analyzer calibrations.

Groups of calibration standards can be developed in accordance with the present invention, each providing, if desired, a different level of mode conversion. Devices having these levels of mode conversion will be measured with improved accuracy. An entire calibration can be accomplished using multiple calibration standards formed in accordance with the present invention (with or without the mode conversion). Alternately, the calibration standard of the present invention can be used in conjunction with other standards, such as impedances, loads, opens, and throughs.

Improved calibration can thus be achieved by interconnecting all of the measurement ports of a network analyzer through the calibration standard described by the invention. The calibration standard described by the invention allows non-zero signals to be transferred between each measurement port and at least one other measurement port of a network analyzer having at least three measurement ports. The number of non-zero signal transfers provided by the calibration standard of the present invention is equivalent to at least the number of measurement ports minus one. Additionally, the calibration standard described by the invention can provide predetermined levels of mode conversion to improve the overall accuracy of device measurement. The limitations associated with prior art calibration standards, such as approximations and simplified assumptions, are overcome with the calibration standard described by the invention.

Accordingly, there has been provided a calibration standard which provides a relative measurement of all the measurement ports of a network analyzer having more than two ports. The calibration standard of the present invention, used in conjunction with other standards, allows for an ordinary solution to the calibration equations (1), (2) to be determined. The calibration standard of the present invention can also provide a predetermined amount of mode conversion if desired. The calibration standard of the present invention is inexpensive and practical to implement and use. Calibration time is reduced and accuracy is improved by using the calibration standard described by the invention in the calibration process of a network analyzer.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of calibrating a network analyzer having at least three measurement ports, including the step of:

operatively coupling each of the measurement ports to provide simultaneous interconnection of the at least three measurement ports; and generating a non-zero transfer function between each of the measurement ports and at least one other measurement port from the at least three measurement ports, the number of non-zero transfer functions being at least equivalent to the number of measurement ports minus one.

2. The method of claim 1, wherein the step of operatively coupling includes the step of:

interconnecting the at least three measurement ports of the network analyzer through transmission lines coupled to a common node.

3. The method of claim 6, wherein the calibration standard provides a predetermined level of mode conversion.

4. The method of claim 1, wherein the non-zero transfer function to at least one other port is reciprocal.

5. The method of claim 1, wherein the non-zero transfer function to at least one other port is non-reciprocal.

6. The method of claim 1, wherein the step of operatively coupling further includes the steps of:

providing a calibration standard having at least as many calibration ports as there are network analyzer ports, each calibration port being operatively interconnected to all other calibration ports; and connecting the at least three measurement ports of the network analyzer to the calibration ports of the calibration standard thereby forming interconnections between each of the at least three measurement ports through the calibration standard.

7. The method of claim 6, further including the steps of:

injecting a signal from at least one measurement port of the network analyzer into its respective calibration port; and determining the relationship between the measurement port from which the signal was injected and the at least one other port with which it has a non-zero transfer function.

8. A calibration standard for a network analyzer having at least three measurement ports, said calibration standard including a plurality of circuit elements operatively coupling the at least three measurement ports simultaneously such that each measurement port is provided with a non-zero transfer function relationship with at least one other measurement port of the at least three measurement ports, the number of non-zero transfer function relationships being at least equivalent to the number of measurement ports minus one.

9. A calibration standard as described in claim 8, wherein the plurality of circuit elements are coupled through a common node in a star configuration.

10. A calibration standard as described in claim 8, wherein the plurality of circuit elements comprises electrically coupled transmission lines.

11. A calibration standard as described in claim 8, wherein the plurality of circuit elements comprise resistive elements.

12. A calibration standard as described in claim 8, wherein the plurality of circuit elements provide a predetermined level of mode conversion to the calibration standard.

13. A calibration standard as described in claim 12, wherein the plurality of circuit elements are disposed on a substrate, the substrate including a plurality of calibration ports coupled to the plurality of circuit elements, each calibration port being coupled to one of the at least three measurement ports of the network analyzer.

14. A calibration standard as described in claim 8, wherein the plurality of circuit elements comprise passive devices.

15. A calibration standard as described in claim 14, wherein the passive devices are variable.

16. A calibration standard as described in claim 8, wherein the circuit elements comprise active devices.

17. A calibration standard as described in claim 16, wherein the active devices are variable.

18. A calibration standard as described in claim 8, wherein the calibration standard provides for a mixed-mode calibration of the network analyzer.

19. A calibration test system, comprising:

a network analyzer having at least three measurement ports; and a calibration standard providing simultaneous interconnection of the at least three measurement ports such that each measurement port is provided with a non-zero transfer function with at least one other measurement port, the number of non-zero transfer functions being at least equivalent to the number of measurement ports minus one.

20. A calibration test system as described in claim 19, wherein the calibration standard provides a predetermined level of mode conversion.

21. A calibration test system as described in claim 20, wherein the calibration standard provides for a mixed-mode calibration of the network analyzer.

22. A calibration test system as described in claim 19, wherein the calibration standard includes active devices providing the interconnection of the at least three measurement ports.

23. A calibration test system as described in claim 22, wherein the active devices are variable.

24. A calibration test system as described in claim 19, wherein the calibration standard includes passive devices providing the interconnection of the at least three measurement ports.

25. A calibration test system as described in claim 24, wherein the passive devices are variable.

26. A calibration test system for a network analyzer, comprising:

a network analyzer having at least three measurement ports; and a calibration standard coupled to the at least three measurement ports and providing simultaneous port-to-port interconnection of each of the at least three measurement ports with all other of the at least three measurement ports.

27. A calibration test system as described in claim 26, wherein the calibration standard provides a predetermined level of mode conversion.

28. A calibration test system as described in claim 26, wherein the calibration standard provides for a mixed-mode calibration of the network analyzer.

* * * * *